United States Patent [19]

Cho et al.

[11] Patent Number: 5,001,669
[45] Date of Patent: Mar. 19, 1991

[54] SEMICONDUCTOR MEMORY CIRCUIT HAVING DUMMY CELLS CONNECTED TO TWISTED BIT LINES

[75] Inventors: Shizuo Cho; Masaru Uesugi, both of Tokyo, Japan

[73] Assignee: Oki Electric Industry Co., Ltd., Tokyo, Japan

[21] Appl. No.: 385,727

[22] Filed: Jul. 26, 1989

[30] Foreign Application Priority Data

Aug. 1, 1988 [JP] Japan .................................. 63-192456

[51] Int. Cl.[5] ............................................ G11C 11/40
[52] U.S. Cl. ....................................... 365/210; 365/207
[58] Field of Search ............ 365/210, 206, 207, 189.01

[56] References Cited

PUBLICATIONS

Tsutomu Yoshihara et al., "A Twisted Bit Line Technique for Multi-Mb DRAMs", 1988 IEEE International Solid-State Circuit Conference, Yoshihara et al., Feb. 19, 1988, pp. 238, 239.

Primary Examiner—Terrell W. Fears
Attorney, Agent, or Firm—Edward D. Manzo

[57] ABSTRACT

A semiconductor memory circuit includes a plurality of bit line pairs each having intersecting portions where the paired bit lines intersect each other, and a plurality of pairs of memory word lines intersecting the bit lines in a direction substantially perpendicular to the bit lines. A plurality of memory cells are individually connected to the memory word lines and bit lines at intersections of one of the memory word lines of the individual memory word line pairs and one of the bit lines of the individual bit line pairs and at intersections of the other of the paired memory word lines and the other of the paired bit lines for storing charges each being associated with data to be sorted. A pair of dummy word lines are interposed between the intersecting portions of the bit lines and intersect the bit line pairs in a direction substantially perpendicular to the bit line pairs. A plurality of dummy cells are individually connected between the dummy word line pairs and the bit line pairs at intersections of one of the dummy word lines of the individual word line pairs and one of the bit lines of the individual bit line pairs and at intersections of the other of the paired dummy word lines and the other of the paired bit lines.

6 Claims, 5 Drawing Sheets

Fig. 5

| DUMMY CELL METHOD | BIT POSITION | SELECTED WORD LINES | | | | | | | |
|---|---|---|---|---|---|---|---|---|---|
| | | SECTION I | | SECTION II | | SECTION III | | SECTION IV | |
| | | a | b | a | b | a | b | a | b |
| IN-PHASE | $\bar{O}$ | B | A | A | B | A | B | B | A |
| | E | C | D | C | D | D | C | D | C |
| ANTI-PHASE | $\bar{O}$ | A | B | B | A | B | A | A | B |
| | E | D | C | D | C | C | D | C | D |

Fig. 6

| DUMMY CELL METHOD | BIT POSITION | SELECTED WORD LINES | | | | | | | |
|---|---|---|---|---|---|---|---|---|---|
| | | SECTION I | | SECTION II | | SECTION III | | SECTION IV | |
| | | a | b | a | b | a | b | a | b |
| IN-PHASE | $\bar{O}$ | B | A | F | E | F | E | J | I |
| | E | D | C | D | C | H | G | H | G |
| ANTI-PHASE | $\bar{O}$ | A | B | E | F | E | F | I | J |
| | E | C | D | C | D | G | H | G | H |

SEMICONDUCTOR MEMORY CIRCUIT HAVING DUMMY CELLS CONNECTED TO TWISTED BIT LINES

BACKGROUND OF THE INVENTION

1. Field of the Invention

The present invention generally relates to a semiconductor memory circuit and, more particularly, to a semiconductor memory circuit having dummy cells which are connected to twisted bit lines.

2. Description of the Prior Art

The current trend in the semiconductor memories art is toward higher integration density, as typified by DRAMs. The higher integration density, however, brings about a problem that the operation characteristics of a semiconductor memory circuit are adversely influenced by the coupling capacitance between bit lines which are included in the memory circuit, especially the coupling capacitance between the individual bit lines of a certain bit line pair and the adjoining bit line pairs. One approach for eliminating this problem has been reported by Yoshihara et al in a paper entitled "Twisted Bit Line Technique for Multi-Mb DRAMs", IEEE International Solid State Circuit Conference (1988), pp. 238-239. Specifically, in a semiconductor memory circuit having a number of bit line pairs, a number of word lines, and a number of memory cells, a twisted bit line system disclosed in the above paper is such that individual bit lines constituting a bit line pair intersect each other in places while being electrically isolated from each other. Such a configuration is successful in equalizing the coupling capacitances between the individual bit lines of a bit line pair and the adjoining bit line pairs. The paper, however, does not show how memory cells and dummy cells are arranged in the semiconductor memory circuit. A specific configuration achievable by installing dummy cells in a twisted bit line type semiconductor memory circuit on the basis of the traditional dummy cell principle would be as follows.

FIG. 4 indicates in a schematic block diagram a part of the above-mentioned assumptive configuration, i.e., three of a number of bit line pairs and their associated elements. In the figure, the three bit line pairs are labeled $\overline{OA}$, EA and $\overline{OB}$. It should be noted that the structure shown in FIG. 4 is not an actual structure heretofore proposed, but it is merely an assumptive structure which would be derived from the technology disclosed in the above paper if the traditional dummy cell concept were applied thereto. In FIG. 4, the individual bit lines of each bit line pair intersect each other at places to form intersections as represented by an intersection 11, as shown and described in the paper. As used in this specification and in the appended claims, any reference to "intersection" or to "intersecting" lines or the like is not meant to denote electrical interconnection, but rather to denote a place where two lines cross one another. This is evident from the drawings which show that at these crossings, electrical contact is avoided. More specifically, assume that the entire length of bit lines is divided into four segments I, II, III and IV. Bit lines $\overline{OA}_1$ and $\overline{OA}_2$ constituting an odd bit line pair $\overline{OA}$, bit lines $\overline{OB}_1$ and $\overline{OB}_2$ constituting an odd bit line pair $\overline{OB}$, and so forth intersect each other in the individual odd bit line pairs at the border between the nearby segments or sections I and II and the border between the nearby sections III and IV. On the other hand, bit lines $EA_1$ and $EA_2$ forming an even bit line pair EA as well as bit lines forming other even bit line pairs intersect each other at the border between the sections II and III. A plurality of word lines are provided in each of the sections I to IV. In FIG. 4, two word lines a and b are shown as being laid in each of the sections I to IV for simplicity. Memory cells $MC_1$, $MC_2$, $MC_3$ and so forth are individually connected to the bit lines and word lines in the junctions of the bit lines and word lines.

In a semiconductor memory circuit typical of which is a DRAM, dummy cells are implemented with either one of an inverted phase dummy cell method or an in-phase dummy cell method. This is to minimize the influence of the wordline-bitline coupling capacitance and to balance the individual bit lines of each bit line pair. The inverted phase dummy cell method is such that a dummy cell on a particular bit line connecting to a designated memory cell is selected by a dummy word line to which a signal whose phase is opposite to the phase of the word line is selected. On the other hand, the in-phase dummy cell method is such that a dummy cell on a particular bit line forming a pair with the other bit line which connects to a designated memory cell is selected by a dummy word line to which a signal whose phase is the same as the word line is selected.

In the memory circuit configuration shown in FIG. 4, the memory cells connected to the same word line are connected to those bit lines of the individual bit line pairs which correspond to each other with respect to the position in the pair. For example, the memory cells $MC_1$, $MC_2$ and $MC_3$ connected to the same word line a in the section I are connected at one terminal thereof to the upper bit lines $\overline{OA}_1$, $EA_1$ and $\overline{OB}_1$ of the bit line pairs $\overline{OA}$, EA and $\overline{OB}$, respectively. Then, as shown in FIG. 4, this kind of configuration would need dummy cells $DC_1$ and $DC_3$ and in the case of the inverted phase dummy cell method $DC_6$ or would need dummy cells $DC_2$, $DC_4$ and $DC_5$ in case of the in-phase dummy cell method having at least two of four dummy word lines A, B, C and D.

FIG. 5 tabulates memory cells and dummy cells which are selected in the above-described semiconductor memory circuit by the in-phase dummy cell system and the anti-phase dummy cell system. Assume that the word line a existing in the section I is selected to access the memory cells $MC_1$, $MC_2$ and $MC_3$ for data being stored therein. Then, the data associated with the memory cells $MC_1$, $MC_2$ and $MC_3$ exist on the bit lines $\overline{OA}_1$, $EA_1$ and $\overline{OB}_1$, respectively. It follows that in the in-phase dummy system the dummy word lines B and C are selected by a signal having the same phase as the word lines to in turn select the dummy cells $DC_2$, $DC_5$ and $DC_4$, while in the antiphase dummy cell system the dummy word lines A and D are selected by a signal opposite in phase to the word lines to in turn select the dummy cells $DC_1$, $DC_6$ and $DC_3$.

In the semiconductor memory circuit shown in FIG. 4, the region (sections I to IV) where the bit lines intersect each other and the region (indicated by a dash-and-dot line in the figure) where the dummy cells are provided are independent of each other. The circuit, therefore, cannot be integrated unless it is provided with exclusive areas for accommodating the two different kinds of regions. This obstructs efficient circuit design which is desirable for higher integration density.

That only a single pair of dummy cells is provided on each bit line pair as shown and described gives rise to another problem. Specifically, in each bit line pair, the time constants of the individual bit lines with respect to their associated sense amplifier are not the same as each other and, therefore, unbalanced. For example, assuming that the word line a in the section I is selected, then the dummy word lines B and C are selected in the in-phase dummy cell system and, as a result, the memory cells and the dummy cells selected are located at opposite remote ends of the bit lines. In this condition, the distance to the memory cells and the distance to the dummy cells as measured from a sense amplifier which is associated with the bit lines greatly differ from each other, resulting in the bit lines of the bit line pair differing from each other in time constant. To promote efficient sense amplification in a bit line pair, it is preferable that paired bit lines have time constants which are as close to each other as possible.

SUMMARY OF THE INVENTION

It is therefore an object of the present invention to provide a twisted bit line type semiconductor memory circuit wherein dummy cells are arranged in a unique configuration so as to solve the problems particular to the prior art as discussed above.

In accordance with the present invention, a semiconductor memory circuit includes a plurality of bit line pairs each having intersecting portions where the bit lines in the pair intersect each other, and a plurality of pairs of memory word lines intersecting the plurality of bit lines in a direction substantially perpendicular to the plurality of bit lines. A plurality of memory cells are individually connected to the plurality of memory word lines and the plurality of bit lines at intersections of one memory word line of the plurality of pairs of memory word lines and one bit line of the plurality of pairs of bit lines and at intersections of the other memory word line of the plurality of pairs of memory word lines and the other bit line of the plurality of pairs of bit lines, for storing charges each being associated with data to be stored. A pair of dummy word lines are interposed between the intersecting portions of the bit lines and intersect the plurality of pairs of bit lines in a direction substantially perpendicular to the plurality of pairs of bit lines. A plurality of dummy cells are individually connected between the pair of dummy word lines and the plurality of pairs of bit lines at intersections of one of the pair of dummy word lines and one bit line of the plurality of pairs of bit lines and at intersections of the other dummy word line of the pair of dummy word lines and the other bit line of the plurality of bit lines.

BRIEF DESCRIPTION OF THE DRAWINGS

The objects and features of the present invention will become more apparent from the consideration of the following detailed description taken in conjunction with the accompanying drawings in which:

FIG. 5 tabulates word lines which are selected in a dummy cell method associated with the prior art circuitry of FIG. 4; and FIG. 6 tabulates word lines which are selected in a dummy cell method associated with the circuitry of FIG. 1.

DESCRIPTION OF THE PREFERRED EMBODIMENT

A preferred embodiment of the semiconductor memory circuit in accordance with the present invention will be described hereinafter with reference to FIGS. 1 to 3. It is to be noted that the figures illustrate the present invention only schematically within the limits of appreciation, and that the present invention is not limited to the illustrative embodiment.

Figure 1:
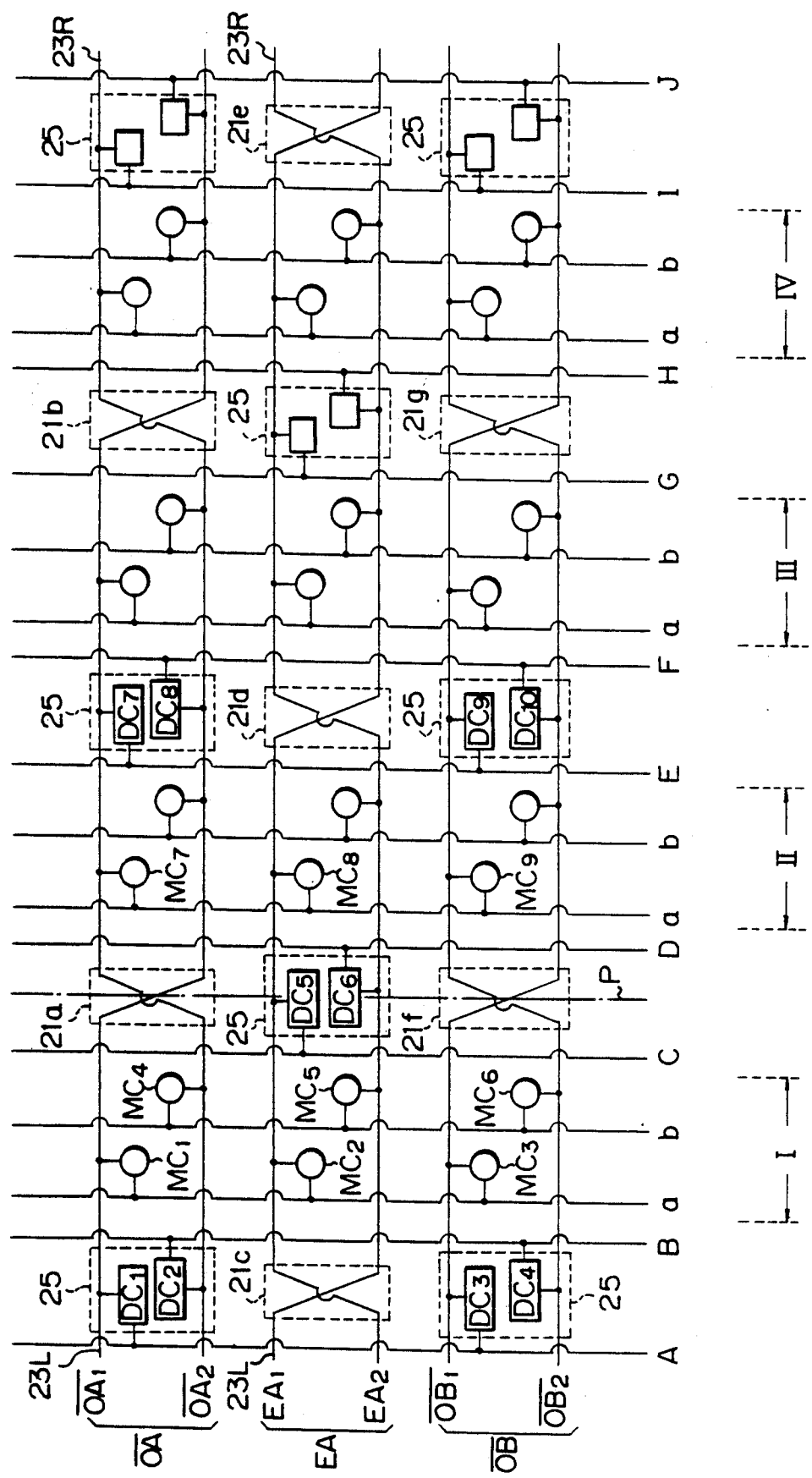
FIG. 1 is a plan view schematically showing a semiconductor memory circuit embodying the present invention.
Figure 2:
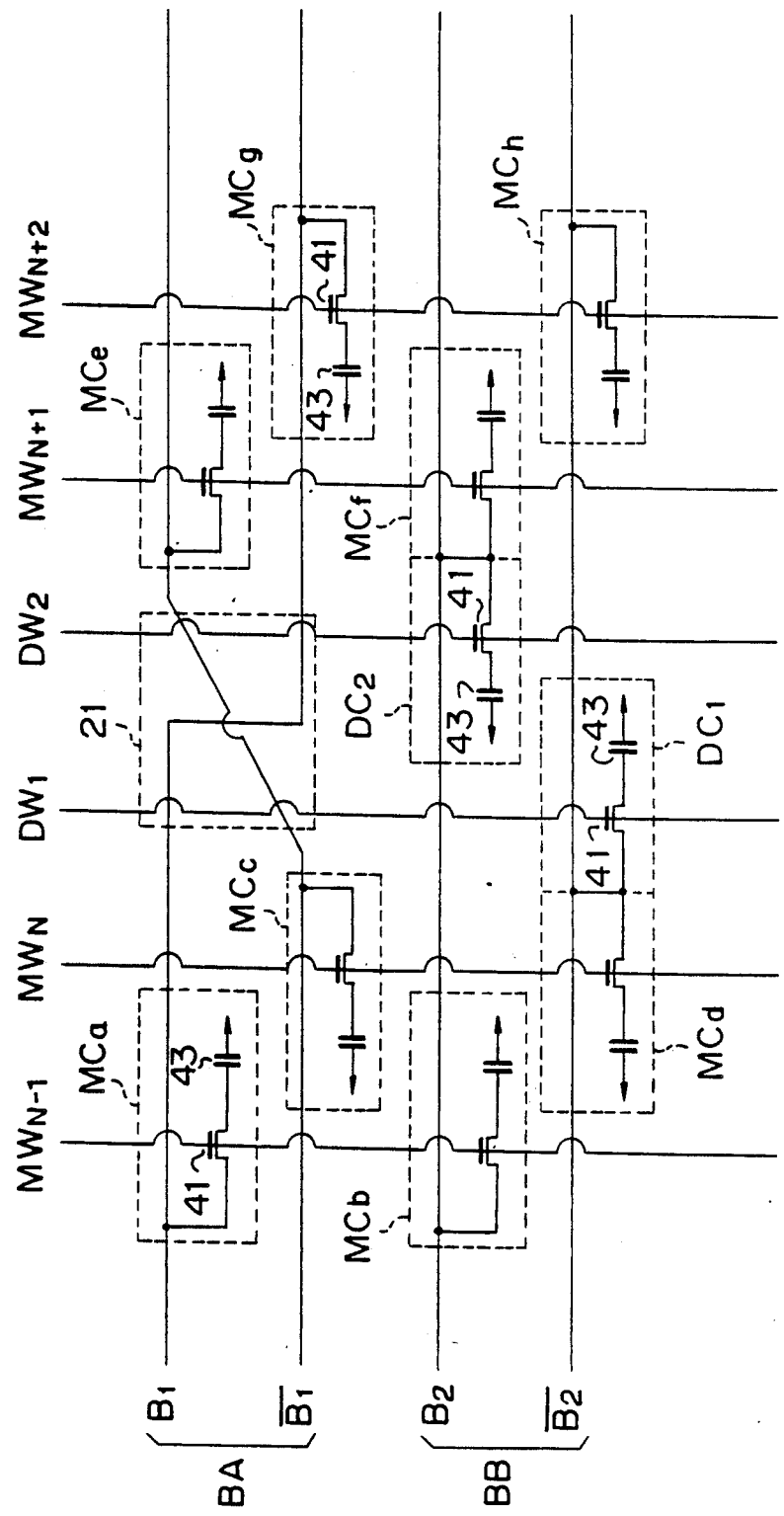
FIG. 2 is a schematic diagram showing an equivalent circuit of the memory circuit of FIG. 1.

Referring to FIG. 1, in which a semiconductor memory circuit embodying the present invention is shown, the following description will concentrate on, among a number of bit line pairs included in the memory circuit, only three bit line pairs $\overline{OA}$, EA and $\overline{OB}$ as shown in the figure. Briefly, the memory circuit has a number of bit line pairs, a number of word lines, a number of memory cells, and a number of dummy cells. The individual bit lines of each bit line pair intersect i.e. cross, each other at places, while dummy cells are interposed between the intersecting points, i.e. cross points, of the paired bit lines. When memory cells exist between an end of the bit line pair and the intersecting point closest to that end, dummy cells are also provided between the end of the bit line pair and the intersecting point. The intersecting points of bit lines in every second bit line pairs are arranged in the same positions, and so are the dummy cells in every second bit line pair. Further, considering two bit line pairs next to each other, the intersecting points of one bit line pair are substantially aligned with the dummy cells of the other bit line pair in the direction of word lines, as represented by an imaginary line P in FIG. 1. Details of the illustrative embodiment will be described hereinafter.

As shown in FIG. 1, the bit lines are divided into four equal segments or sections I, II, III and IV. In odd bit line pairs $\overline{OA}$, $\overline{OB}$ and so forth included in the memory circuit, the paired bit lines intersect each other in a boundary region between the sections I and II and in a boundary region between the sections III and IV, forming intersecting portions 21a, 21b, 21f and 21g. On the other hand, in an even bit line pair EA as well as in other even bit line pairs, the paired bit lines intersect each other in a boundary region between the end 23L or 23R of the bit line pair and the section I or IV adjacent to that end 23L or 23R, and in a boundary region between the sections II and III, forming intersecting portions 21c, 21d and 21e. A pair of dummy word lines are provided between nearby intersecting portions of each bit line pair. Specifically, in the illustrative embodiment, five pairs of dummy word lines (A, B), (C, D), (E, F), (G, H) and (I, J) are provided between the intersecting portions 21a and 21b, between the intersecting portions 21c and 21d, and between the intersecting portions 21d and 21e. Dummy cells $DC_m$ ($DC_1$, $DC_2$, $DC_3$, ...) are connected to the dummy word lines A to J. A plurality of word line pairs are laid in each of the sections I to IV. In the figure, such word line pairs in each of the sections I to IV are represented by a single pair of word lines a and b for simplicity. Memory cells $MC_n$ ($MC_1$, $MC_2$, $MC_3$, ...) are individually connected to the bit lines and the word lines which intersect with the bit lines, in the neighborhood of the points where the two kinds of lines intersect. In this embodiment, when memory cells exist between the end 23L or 23R of any of the bit line pairs and the intersecting portion of the bit line pair which is closest to the end 23L or 23R, e.g., between the left end 23L of the bit line pair $\overline{OA}$ and the intersecting portion 21a and the right end 23R of the bit line pair $\overline{OA}$ and the intersecting portion 21b, dummy cells are also provided there. It is to be noted that the number of sections, the number of dummy word lines, the number of dummy cells and other specific numerical values are only illustrative and not restrictive.

FIG. 6 tabulates a relationship between the memory cells and the dummy cells of the above-described semiconductor memory circuit which are selected in the in-phase dummy cell system and the antiphase dummy cell system. Assuming that the word line a in the section II is selected to access data which are stored in the memory cells MC7, MC8 and MC9 by way of example, then those data exist on the bit lines $\overline{OA}_2$, $EA_2$ and $\overline{OB}_2$. In accordance with the present invention, those memory cells which are nearest to the memory cells being selected and, yet, do not have any intersecting portion between themselves and the memory cells being selected can be selected. More specifically, in the in-phase dummy cell method, the dummy word lines F and D are selected by the word line a and an in-phase signal to in turn select the dummy cells $DC_8$, $DC_6$ and $DC_{10}$. In the antiphase dummy cell system, the dummy word lines E and C are selected by the word line a and an antiphase signal so as to select the dummy cells $DC_7$, $DC_5$ and $DC_9$. Hence, the distance to the memory cells and the distance to the dummy cells as measured from the end of the bit lines are substantially equal to each other.

In the circuit configuration shown in FIG. 1, sense amplifiers for reading bit line data are usually located at either one of the right ends 23R and the left ends 23L of the individual bit line pairs. Assuming that sense amplifiers are located at the right ends 23R of the bit line pairs, it will be seen that the intersecting portion 21c which adjoins the left end 23L of each even bit line pair is not so significant in balancing coupling capacitances. Therefore, the intersecting portion 21c is omissible, if desired. On the other hand, the intersecting portions 21a and 21f of each odd bit line pair contribute a great deal to the balance of coupling capacitances.

More specifically, with reference to FIG. 1, reading the data stored in, e.g., memory cells MC1, MC4, and MC3, MC6 occurs by sensing the potential differences between the conductive lines of bit line pairs OA and OB through intersecting portions 21a and 21f, respectively. The intersecting (crossing) portions 21a and 21f are therefore indispensable to balancing the coupling capacitance between the odd and even bit line pairs. For this aim, intersecting portions 21a and 21f of the odd bit line pairs OA and OB, respectively, are located in the vicinity of the straight portions of the conductor lines of the even bit line pair EA. However, the even bit line pair EA does not include any memory cell on the left of intersecting portion 21c and for this reason, data is not read through the intersecting portion 21c. Accordingly, the intersecting portion 21c is not so significant for balancing coupling capacitances as the intersecting portions 21a and 21f. The parts of the conductive wire per se included in the intersecting portions are so short as to be ineffective to take into account for balancing the coupling capacitances, and hence do not contribute to balancing of the capacitances. When sense amplifiers are connected to the left ends 23L of the individual bit line pairs, the above relationship will be reversed as to the significance.

Hereinafter will be described an equivalent circuit and a specific pattern layout for actually fabricating the semiconductor memory having the above-stated configuration. FIGS. 2 and 3 indicate respectively an equivalent circuit and a specific pattern layout of the memory circuit. The figures show only a part of the memory circuit which includes some of the intersecting portions, memory cells, and dummy cells. As shown, bit lines $B_1$ and $\overline{B}_1$ constitute a single bit line pair BA, and bit lines $B_2$ and $\overline{B}_2$ constitute another bit line pair BB. Word lines, or memory word lines, are labeled $MW_{n-1}$, $MW_n$, $MW_{n+1}$ and $MW_{n+2}$, while dummy word lines are labeled $DW_1$ and $DW_2$. Eight memory cells $MC_a$ to $MC_h$ are individually positioned at the intersecting portions of the bit lines and memory word lines. Looking the bit lines BA and BB in a direction parallel to the word lines, the intersecting portion 21 of the bit line BA and the dummy cells $DC_1$ and $DC_2$ associated with the bit line BB are substatially aligned with each other on a certain word line. In the illustrative embodiment, the memory cells and dummy cells are each implemented by a single MOS transistor 41 and a single capacitor 43 by way of example.

Figure 3:
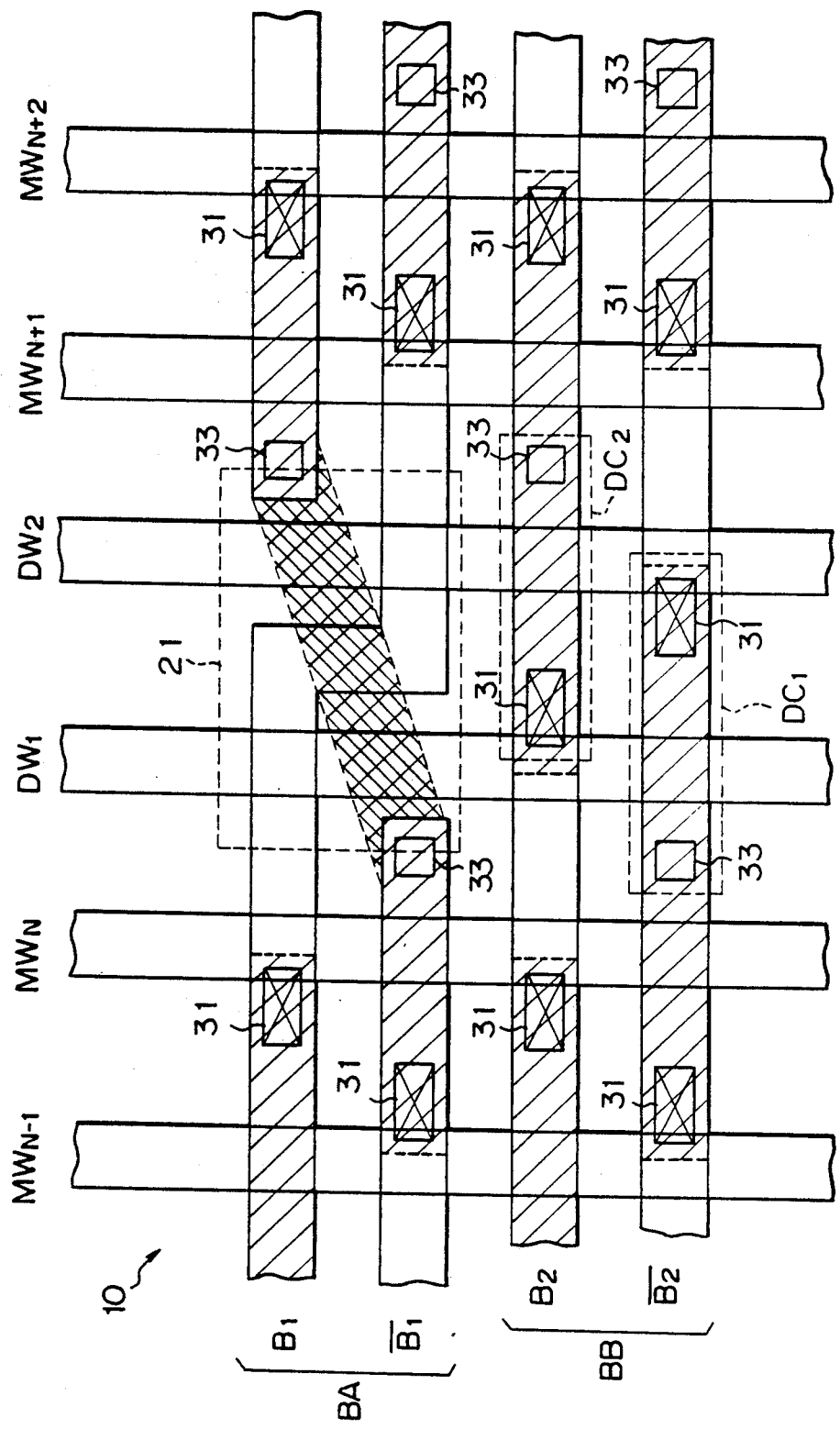
FIG. 3 shows a specific layout of the memory circuit in accordance with the illustrative embodiment.
Figure 4:
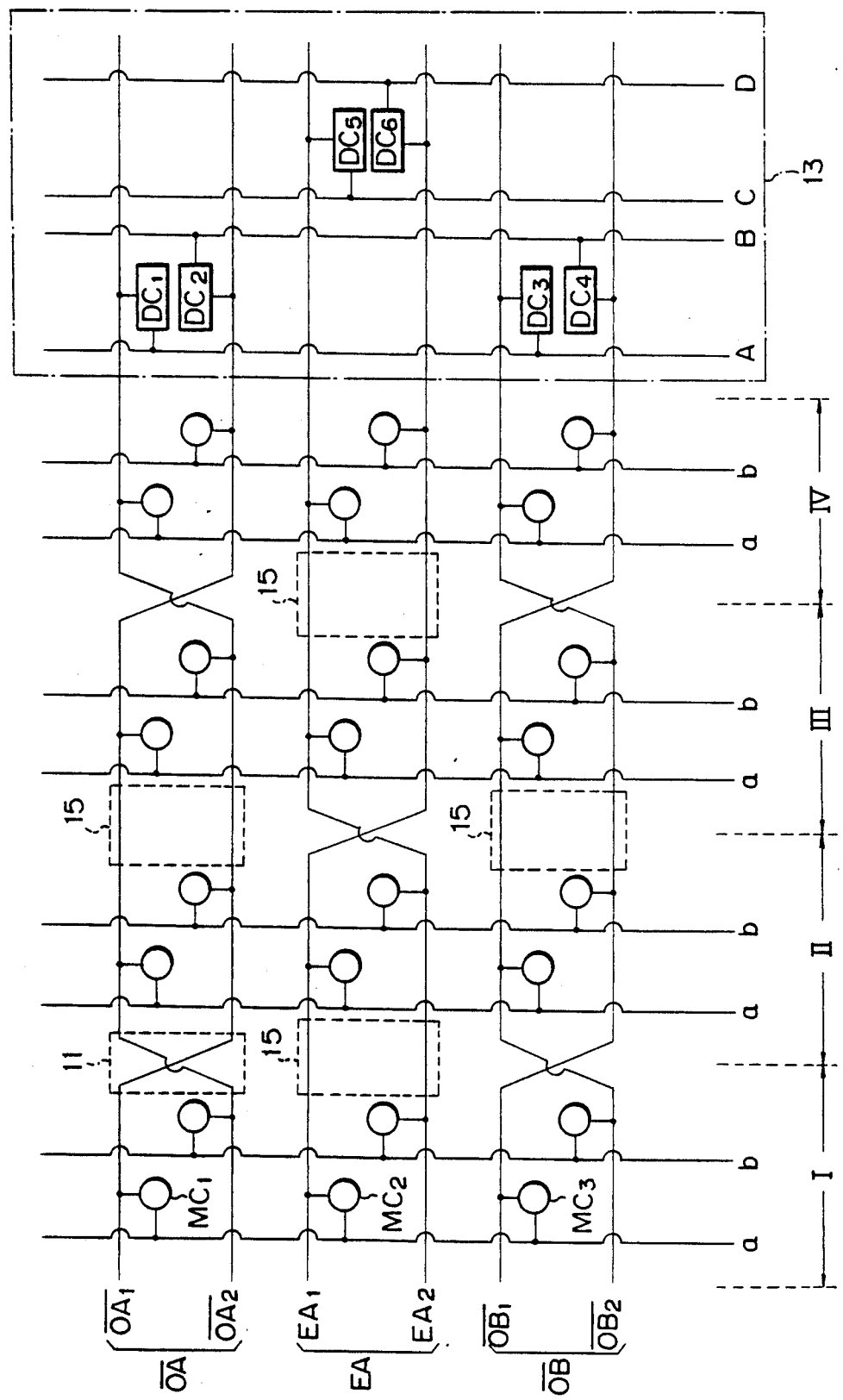
FIG. 4 is a schematic plan view representative of a prior art semiconductor memory circuit.

In FIG. 3, the specific layout is provided in a MOS configuration on a semiconductor substrate 10. The memory word lines MW and dummy word lines DW are made of polysilicon, while the bit lines are made of metal except for their intersecting portions 21. In each intersecting portion 21, one of the paired bit lines (bit line $B_1$ in the example) is made of metal with the other bit line (bit line $\overline{B}_1$ in the example) being implemented as a diffusion layer. Capacitor portions 31 and contact portions 33, which interconnect the metal and the diffused layer, are also provided on the substrate 10. Double-hatching in FIG. 3 is representative of portions where only the diffusion layer exists. Of course, the specific layout shown in the figure is only illustrative and may be replaced with any other suitable layout.

In summary, in accordance with the present invention, a semiconductor memory circuit has word lines, or memory word lines, and dummy word lines which are located between nearby intersecting points of paired bit lines. This reduces the distance to dummy cells as measured along bit lines to substantially ¼ of the prior art configuration, whereby memory cells and dummy cells are located at substantially the same distance as measured from the ends of bit lines. It follows that the time constant of the bit lines from any of the word lines to the ends of the bit lines and the time constant of the same from any of the dummy word lines to the ends are substantially the same as each other, promoting highly sensitive and efficient sense amplification.

Further, intersecting portions of one of nearby bit line pairs are substantially aligned with dummy cells of the other bit line pair in a direction parallel to word lines. Dummy cells, therefore, assume substantially the same positions as the bit line portions which are necessary to form the intersecting portions and, yet, the former occupy only substantially the same area as the latter. Hence, a miniature semicondutor memory circuit free from wasteful regions is realized.

While the present invention has been described with reference to the particular illustrative embodiment, it is not to be restricted by the embodiment but only by the appended claims. It is to be appreciated that those skilled in the art can change or modify the embodiment without departing from the scope and spirit of the present invention.

What is claimed is:

1. A semiconductor memory circuit comprising:
   a plurality of bit line pairs each having intersecting portions where bit lines in said pair cross each other;
   a plurality of pairs of memory word lines crossing the plurality of bit lines in a direction substantially perpendicular to said plurality of bit lines;
   a plurality of memory cells for storing charge corresponding to data to be stored in the memory, each of said memory cells being connected to a corresponding one of said memory word lines and a corresponding one of said bit lines at either (a) an intersection of one memory word line of said plurality of pairs of memory word lines with one bit line of said plurality of pairs of bit lines, or (b) an intersection of the other memory word line of said plurality of pairs of memory word lines with the other bit line of said plurality of pairs of bit lines;
   a pair of dummy word lines interposed between the intersecting portions of the bit lines and intersecting the plurality of pairs of bit lines in a direction substantially perpendicular to said plurality of pairs of bit lines; and
   a plurality of dummy cells individually connected between the pair of dummy word lines and the plurality of pairs of bit lines at intersections of one of said pair of dummy word lines and one bit line of said plurality of pairs of bit lines and at intersections of the other dummy word line of said pair of dummy word lines and the other bit line of said plurality of bit lines.

2. A memory circuit in accordance with claim 1, wherein the bit lines of any of the plurality of pairs of bit lines have the intersecting portions located in positions which correspond to positions between the intersecting portions of the pairs of bit lines which adjoin said pair.

3. A memory circuit in accordance with claim 2, wherein in any of the plurality of pairs of bit lines which has the memory cells between one of opposite ends and the intersecting portion closest to said end, the dummy cells and the dummy word lines are interposed between said end and said closest intersecting portion.

4. A memory circuit in accordance with claim 2, wherein the plurality of dummy cells are individually aligned with the intersecting portions of the bit line pairs which are adjacent to the bit line pairs associated with said plurality of dummy cells, in a direction parallel to the dummy word lines.

5. A memory circuit in accordance with claim 2, wherein said memory circuit is fabricated in a MOS configuration on a semiconductor substrate;
   the plurality of memory word lines and the pair of dummy word lines including polysilicon;
   the plurality of pairs of bit lines including metal except for the intersecting portions, one bit line of said plurality of bit lines including metal in the intersecting portions, the other bit line including a diffusion layer in the intersecting potions.

6. A memory circuit in accordance with claim 5, wherein each of the memory cells comprises a first MOS transistor and a first capacitor, said first MOS transistor comprising a source-drain path connected in series with said first capacitor and a control electrode connected to any of the memory word lines;
   each of the plurality of dummy cells comprising a second MOS transistor and a second capacitor, said second MOS transistor comprising a source-drain path connected in series with said second capacitor and a control electrode connected to any of the dummy word lines.

* * * * *